United States Patent
Cho et al.

(10) Patent No.: US 7,084,565 B2
(45) Date of Patent: Aug. 1, 2006

(54) ASSEMBLY OF ORGANIC ELECTROLUMINESCENCE DISPLAY DEVICE

(75) Inventors: Sang-Hwan Cho, Suwon (KR); Young-Rag Do, Seoul (KR); Yoon-Chang Kim, Suwon (KR); Ji-Hoon Ahn, Seoul (KR); Joon-Gu Lee, Goyang (KR)

(73) Assignee: Samsung SDI Co., Ltd., Suwon-si (KR)

( * ) Notice: Subject to any disclaimer, the term of this patent is extended or adjusted under 35 U.S.C. 154(b) by 134 days.

(21) Appl. No.: 10/784,192

(22) Filed: Feb. 24, 2004

(65) Prior Publication Data

US 2004/0183433 A1 Sep. 23, 2004

(30) Foreign Application Priority Data

Mar. 6, 2003 (KR) .................... 10-2003-0014000

(51) Int. Cl.
*H05B 33/22* (2006.01)

(52) U.S. Cl. .................. 313/504; 313/506; 313/509; 345/44; 345/45; 345/76

(58) Field of Classification Search ........ 313/503–506, 313/509; 349/73; 345/44, 45, 76
See application file for complete search history.

(56) References Cited

U.S. PATENT DOCUMENTS

| | | | | |
|---|---|---|---|---|
| 5,013,141 A | * | 5/1991 | Sakata | 349/201 |
| 5,307,363 A | * | 4/1994 | Hosokawa et al. | 372/53 |
| 5,804,917 A | * | 9/1998 | Takahashi et al. | 313/504 |
| 5,874,803 A | * | 2/1999 | Garbuzov et al. | 313/506 |
| 5,940,568 A | * | 8/1999 | Losch | 385/129 |
| 5,994,835 A | * | 11/1999 | Wilson et al. | 313/504 |
| 6,013,538 A | * | 1/2000 | Burrows et al. | 438/22 |
| 6,392,338 B1 | * | 5/2002 | Hori et al. | 313/504 |
| 2001/0002703 A1 | * | 6/2001 | Koyama | 257/40 |
| 2001/0019242 A1 | | 9/2001 | Tada et al. | |
| 2001/0033136 A1 | * | 10/2001 | Kawase | 313/506 |
| 2003/0015962 A1 | * | 1/2003 | Murasko et al. | 313/509 |
| 2003/0071566 A1 | * | 4/2003 | Kwasnick et al. | 313/504 |
| 2003/0164496 A1 | * | 9/2003 | Do et al. | 257/40 |

FOREIGN PATENT DOCUMENTS

| | | |
|---|---|---|
| JP | 63-172691 | 7/1988 |
| JP | 01-220394 | 9/1989 |
| JP | 09-171892 | 6/1997 |
| JP | 10-012382 | 6/1998 |
| JP | 11-283751 | 10/1999 |

* cited by examiner

*Primary Examiner*—Ashok Patel
*Assistant Examiner*—Christopher M. Raabe
(74) *Attorney, Agent, or Firm*—Stein, McEwen & Bui, LLP (57) ABSTRACT

An organic electroluminescence (EL) display device assembly includes a substrate, an organic EL portion, an optical loss prevention layer, and a fine space layer. The organic EL portion has a first electrode layer, an organic luminescent layer, and a second electrode layer which are each patterned and stacked on the upper surface of the substrate. The optical loss prevention layer is used to increase light bleeding efficiency. The fine space layer is formed between the optical loss prevention layer and a layer facing the optical loss prevention layer and is filled with a gas or evacuated.

48 Claims, 12 Drawing Sheets

ASSEMBLY OF ORGANIC ELECTROLUMINESCENCE DISPLAY DEVICE

CROSS-REFERENCE TO RELATED APPLICATIONS

This application claims the benefit of Korean Application No. 2003-14000, filed Mar. 6, 2003, in the Korean Intellectual Property Office, the disclosure of which is incorporated herein by reference.

BACKGROUND OF THE INVENTION

1. Field of the Invention

The present invention relates to organic electroluminescence (EL) display devices, and more particularly, to an organic EL display device with improved light bleeding efficiency of light emitted from an organic film.

2. Description of the Related Art

Organic EL display devices are spontaneous light-emitting display devices that emit light by electrically exciting a fluorescent organic compound. Typically, organic EL display devices may operate at a low voltage, be formed compactly to form a thin device, and provide a wide viewing angle and a high response speed. Organic EL display devices are the focus of considerable attention because they may be used as next-generation display devices that are free of the problems of liquid crystal display devices.

In such organic EL display devices, a predetermined pattern of organic films is formed on glass or a transparent insulative substrate, and electrode layers are formed on the top and bottom surfaces of the organic film pattern. The organic films may be made of various organic compounds such as copper phthalocyanine (CuPc), N,N'-Di (naphthalene-1-yl)-N,N'-diphenyl-benzidine (NPB), and tris-8-hydroxyquinoline aluminum (Alq3).

In organic EL display devices having the above-described structure, as positive and negative voltages are applied to electrodes, holes migrate from electrodes to which the positive voltage is applied to a luminescent layer via a hole transport layer and electrons migrate from electrodes to which the negative voltage is applied to the luminescent layer via the hole transport layer. In the luminescent layer, the holes and the electrons re-unite to generate excitons. As the excitons de-excite, fluorescent molecules in the luminescent layer emit light, thus forming an image.

The light efficiency of organic EL display devices driven as described above includes internal efficiency and external efficiency (or light bleeding efficiency). Internal efficiency relates to the efficiency of photoelectric conversion of an organic luminescent material, and external efficiency depends on the refractive indices of the layers that constitute the organic EL display device. In other words, when light is emitted from the organic films at a critical angle or greater, the emitted light is reflected at the interface between the substrate and the electrode layers or between the organic films and the electrode layers. Thus, the emitted light is prevented from being bled off.

Figure 1:
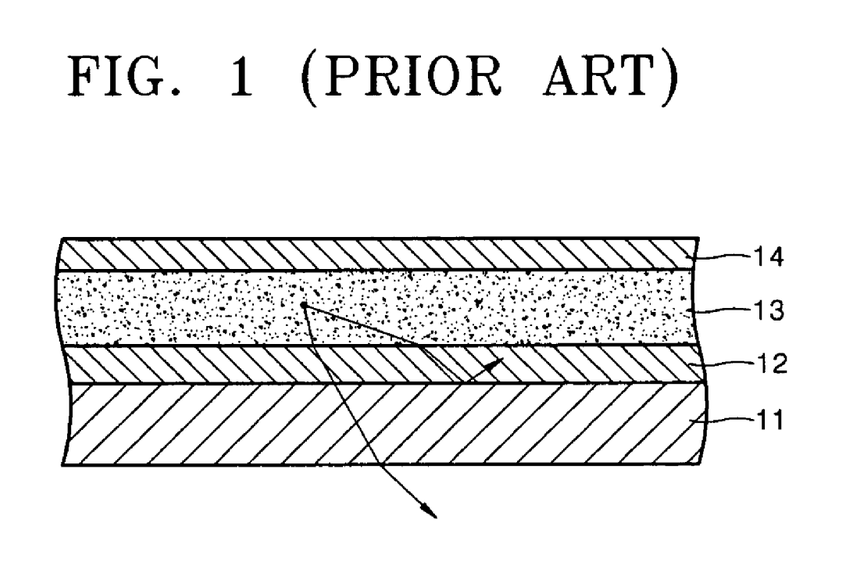
FIG. 1 is a cross-sectional view for illustrating light bleeding that occurs in a conventional organic EL display device.

In a conventional organic EL display device, as shown in FIG. 1, when light emitted from an organic film 13, which is protected by a metal cathode layer 14, is transmitted through an interface between indium tin oxide (ITO) electrodes 12 and a transparent glass substrate 11, to the transparent glass substrate 11, the light transmittance T is given by: $T=1/2(n_{glass}/n_{ITO})^2$, wherein $n_{glass}$ denotes the refractive index of glass and $n_{ITO}$ denotes the refractive index of ITO.

Based on the above equation, the light bleeding efficiency for individual colors of a conventional organic EL display device is shown in the following table.

| | Blue organic film | Red organic film | Green organic film |
|---|---|---|---|
| Wavelength (nm) | 460 | 620 | 530 |
| Refractive index (n) of ITO electrodes | 2.01 | 1.76 | 1.93 |
| Refractive index (n) of glass substrate | 1.525 | 1.515 | 1.52 |
| Light bleeding efficiency | 29% | 37% | 34% |

As shown in the above table, 60% or more of the light generated in an organic EL display device is extinguished within the device due to the difference between the refractive indices of the ITO electrodes and the glass substrate.

Japanese Patent Publication No. hei 11-283751 discloses an organic EL display device having a structure in which a diffraction grating or a zone plate is formed on a substrate to diffract light guided by ITO electrodes and by an interface between organic films and the ITO electrodes, thus reducing light loss. Since this organic EL display device requires a wavy substrate, a wavy fine electrode pattern layer, or a special diffraction grating, its manufacturing process is complicated. Also, when an organic layer is formed on the wavy surface or the diffraction grating, the surface illumination of the organic layer increases. Thus, the leakage current of the organic EL display device increases and durability and reliability decrease.

An example of a conventional organic EL display device which prevents degradation of light bleeding efficiency is disclosed in Japanese Patent Publication No. sho 63-172691. The disclosed organic EL display device includes a condensed substrate such as a substrate on which a protrusion lens is installed. However, since pixels depending on the luminescence of an organic film are very small, it is difficult to install the protrusion lens for condensing on the substrate.

Japanese Patent Publication No. hei 1-220394 discloses an organic EL display device in which lower electrodes, an insulating layer, a luminescent layer, and upper electrodes are formed on a substrate, and a mirror that reflects light is installed on a single face of the luminescent layer. In this organic EL display device, since the luminescent layer is very thin, it is very difficult to install a reflective mirror on one side of the luminescent layer.

However, Japanese Patent Publication No. hei 9-171892 discloses an organic EL display device in which anodes and an anode interface layer are formed on a glass substrate having a lens-shaped structure installed thereon, and a hole transport layer, a luminescent layer, an electron transport layer, cathodes, and an anode protective layer are formed on the resulting glass substrate. In this organic EL display device, since reflected light bleeds toward the glass substrate, the bleeding efficiency increases, but images become blurred.

Japanese Patent Publication No. hei 10-12382 discloses an organic EL display device that has a light guide formed between front electrodes of an organic luminescent device and a group of small lenses incorporated into the front surface of the light guide, such that emitted light is guided to the front electrodes, and light bleeds evenly.

U.S. Patent Publication No. 2001/0019242A1 also discloses an organic EL display device and a method of manufacturing the same.

SUMMARY OF THE INVENTION

The present invention provides an organic EL display device assembly which reduces internal optical loss and increases light bleeding efficiency to increase the luminance of an image.

The present invention also provides an organic El display device which reduces optical loss using a scattering efficiency at an interface between a layer with a high refractive index and a layer with a low refractive index.

According to an embodiment of the present invention, an organic electroluminescence (EL) display device assembly includes a substrate, an organic EL portion, an optical loss prevention layer, and a fine space layer. The organic EL portion has a first electrode layer, an organic luminescent layer, and a second electrode layer, which are each patterned and stacked on the upper surface of the substrate. The optical loss prevention layer increases light bleeding efficiency. The fine space layer is formed between the optical loss prevention layer and a layer facing the optical loss prevention layer and is filled with a gas or evacuated.

The optical loss prevention layer is a diffraction grating forming unit with a plurality of protrusions which form a pattern.

According to another embodiment of the present invention, an organic EL display device assembly includes a substrate, an organic EL display portion, a photonic plate, and a fine space layer. The organic EL display portion has a first electrode layer, an organic luminescent layer, and a second electrode layer, which are each patterned and stacked on the upper surface of the substrate. The photonic plate is combined with the organic EL display portion and has an optical loss prevention layer formed over the organic EL display portion. The fine space layer is formed between the optical loss prevention layer and the photonic plate and increases the light bleeding efficiency of light generated by the organic luminescent layer.

According to still another embodiment of the present invention, an organic EL display device assembly includes a substrate, first and second electrode layers, an organic luminescent layer, an optical loss prevention layer, and a space layer. The first electrode layer, the organic luminescent layer, and the second electrode layer are sequentially stacked on the upper surface of the substrate. The optical loss prevention layer is formed between layers having a substantial difference in the refractive index among the first and second electrode layers and the organic luminescent portion, and has areas with different refractive indices. The space layer is formed between the optical loss prevention layer and a layer facing the optical loss prevention layer and is filled with a gas or evacuated.

According to still yet another embodiment of the present invention, an organic EL display device assembly includes a substrate, a pixel portion, a driving portion, and a photonic plate. The pixel portion has a first electrode layer patterned on the substrate, an organic luminescent layer patterned on the upper surface of the first electrode layer, an insulating layer formed on the upper surface of the substrate to expose the organic luminescent layer, and a second electrode layer which is transparent and patterned on the upper surface of the organic luminescent layer and the upper surface of the insulating layer. The driving portion is formed on the substrate and has thin film transistors for switching the first electrode layer. The photonic plate is located on the upper surface of the transparent second electrode layer to form a fine space layer that is filled with an inert gas or evacuated and is located between the photonic plate and the second electrode layer, and has an optical loss prevention layer formed on the inside surface of the photonic plate.

According to yet another embodiment of the present invention, an organic EL display device assembly includes a substrate, a pixel portion, a driving portion, an optical loss prevention layer, and a photonic plate. The pixel portion has a first electrode layer patterned on the substrate, an organic luminescent layer patterned on the upper surface of the first electrode layer, an insulating layer formed on the upper surface of the substrate to expose the organic luminescent layer, and a second electrode layer which is transparent and patterned on the upper surface of the organic luminescent layer and the upper surface of the insulating layer. The driving portion is formed on the substrate and has thin film transistors for switching the first electrode layer. The optical loss prevention layer is formed between the substrate and the first electrode layer and has patterned areas with different refractive indices. The space layer is filled with an inert gas or evacuated and formed between the optical loss prevention layer and a layer facing the optical loss prevention layer.

According to an embodiment of the present invention, an organic EL display device assembly is utilized in a computer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
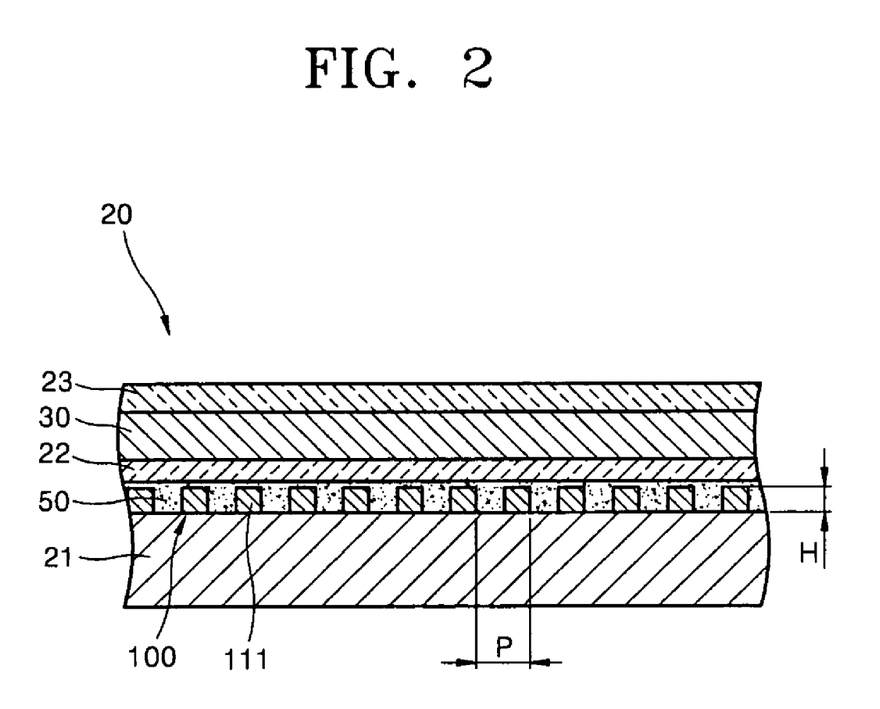
FIG. 2 is a cross-section of an organic EL display device assembly according to a first embodiment of the present invention.

An organic EL display device according to the present invention improves the bleeding efficiency of light emitted from an organic luminescent layer. FIG. 2 shows a magnified part of an organic EL display device assembly 20 according to an embodiment of the present invention.

Referring to FIG. 2, the organic EL display device assembly 20 includes first and second electrode layers 22 and 23 and an organic luminescent layer 30. The first electrode layer 22 is transparent and is formed on the upper surface of a transparent substrate 21 in a predetermined pattern. The organic luminescent layer 30 is formed by stacking organic films on the upper surface of the first electrode layer 22. The second electrode layer 23 is formed on the upper surface of the organic luminescent layer 30 and has a predetermined pattern.

The first electrode layer 22 is an anode formed on/proximate to the upper surface of the transparent substrate 21 and may be made of indium tin oxide (ITO), which is a transparent conductive material. The second electrode layer 23 may be formed of a conductive metal such as aluminium, an aluminium alloy, silver, or a silver alloy.

Figure 3:
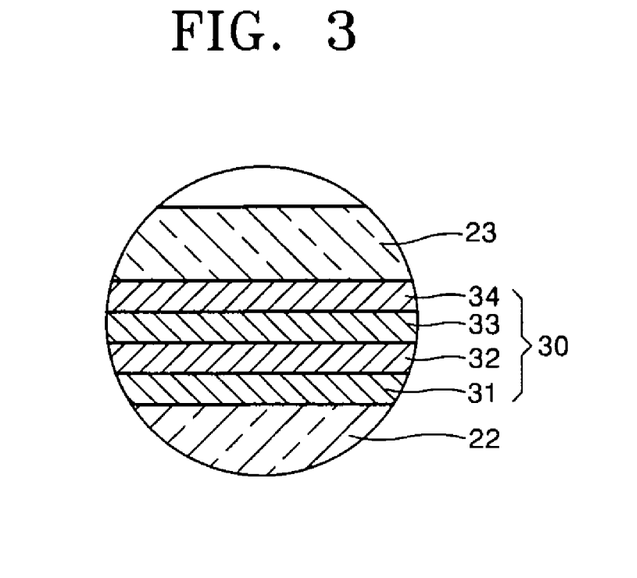
FIG. 3 is a magnified cross-section of the organic luminescent layer of FIG. 2.

As shown in FIG. 3, the organic luminescent layer 30 is formed by sequentially stacking a hole implantation layer 31, a hole transport layer 32, a luminescent layer 33, and an electron implantation layer 34 on the upper surface of the first electrode layer 21. Preferably, the luminescent layer 33 is formed of a low polymer organic compound, such as tris-8-hydroxyquinoline aluminum (Alq3), or a high polymer organic compound, such as, polyparaphenylene-vinylene (PPV) or poly(2-Methoxy-5-(2-Ethylhexyloxy)-1,4-phenylenevinylene. However, the material of the luminescent layer 33 is not limited to these materials.

An optical loss prevention layer 100 for improving light bleeding efficiency is formed on the upper surface of the transparent substrate 21. A fine space layer 50, which is filled with a gas or evacuated, is formed between the optical loss prevention layer 100 and the first electrode layer 22.

The optical loss prevention layer 100 may be a diffraction grating having a plurality of protrusions 111 each having a predetermined pitch (P) and a predetermined height (H). Preferably, the pitch P of the protrusions 111 of the diffraction grating is 200 nm to 2000 nm, and the height H thereof is 50 nm to 5000 nm. Each of the protrusions 111 may have various shapes, such as a circular cylindrical shape or a multilateral pyramidal shape. The protrusions 111 may have any shape as long as they protrude to have a predetermined pattern. Alternatively, a thin film having a plurality of through holes for a diffraction grating may be formed on the upper surface of the transparent substrate 21.

The optical loss prevention layer 100, which is a diffraction grating, may be formed of at least one material selected from the group consisting of $SiO_x(x>1)$, $SiN_x$, $Si_3N_4$, $TiO_2$, MgO, ZnO, $Al_2O_3$, $SnO_2$, $In_2O_3$, $MgF_2$, and $CaF_2$. Preferably, the optical loss prevention layer 100 is formed of $TiO_2$.

The fine space layer 50 may be formed in such a way that the protrusions 111 of the diffraction grating are closely adhered to the first electrode layer 22 and to the side on which the first electrode layer 22 is formed. Also, extra spacers (not shown) may be included in the fine space layer 50.

Figure 4:
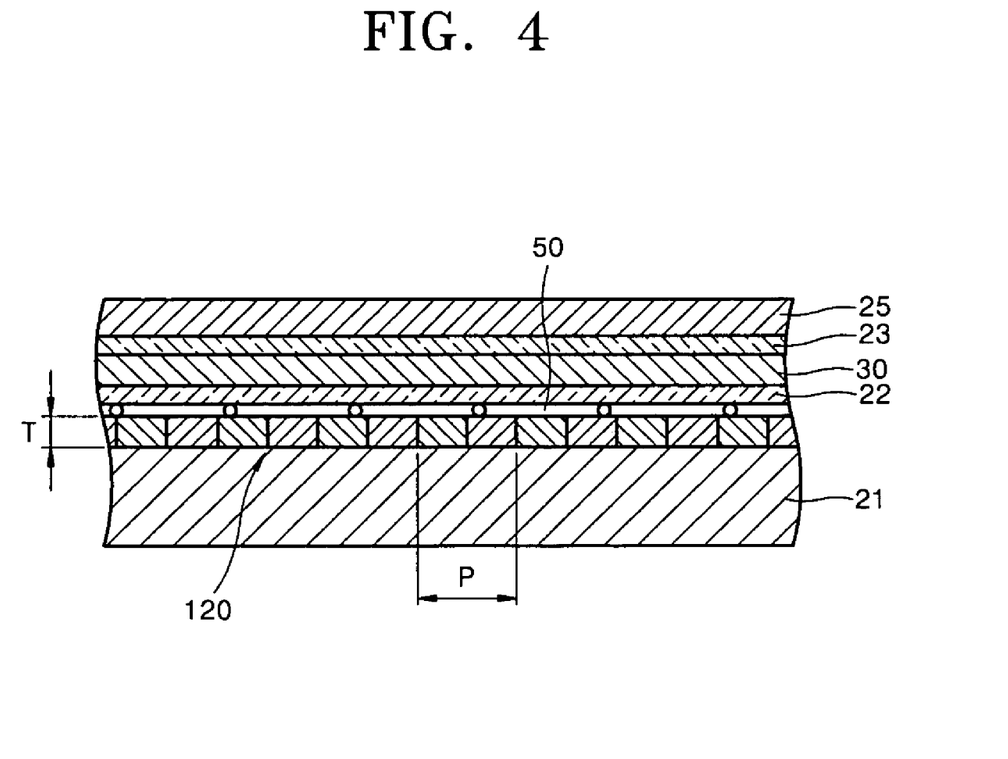
FIG. 4 is a cross-section of an organic EL display device assembly according to a second embodiment of the present invention.

On the other hand, as shown in FIG. 4, instead of the optical loss prevention layer 100, a patterned thin film 120 may be formed to have first and second areas formed of at least two materials with different refractive indices. Preferably, the pitch (P) of one of the two areas arranged in a predetermined pattern is 200 nm to 2000 nm corresponding to the pitch of the protrusions 111, and the thickness (T) of the thin film 120 is 0.01 μm to 50 μm. In the embodiment of FIG. 4, the first and second electrode layers 22 and 23 and the organic luminescent layer 30 are formed on an extra upper substrate 25.

Figure 5:
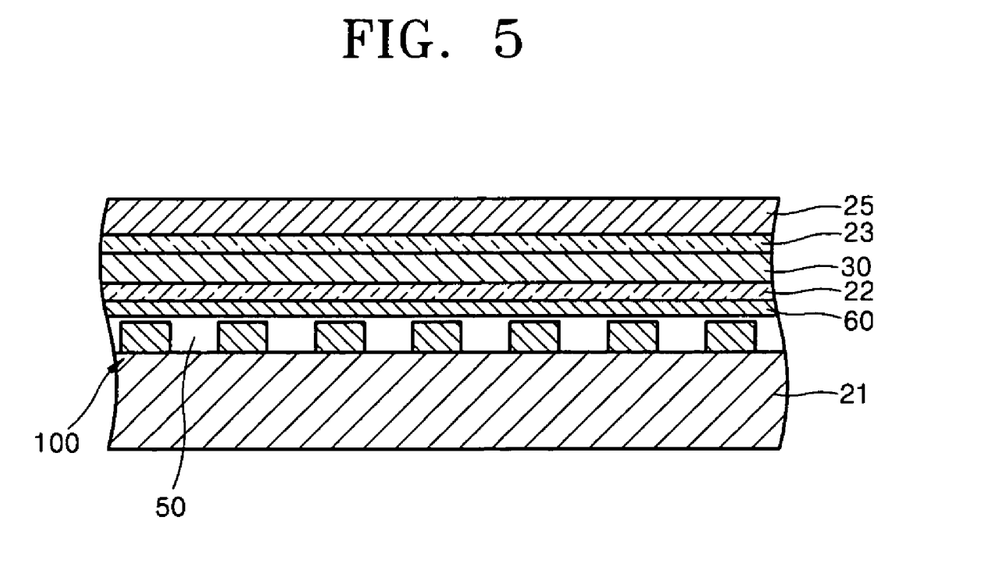
FIGS. 5 and 6 are cross-sections of organic EL display device assemblies according to third and fourth embodiments of the present invention.
Figure 6:
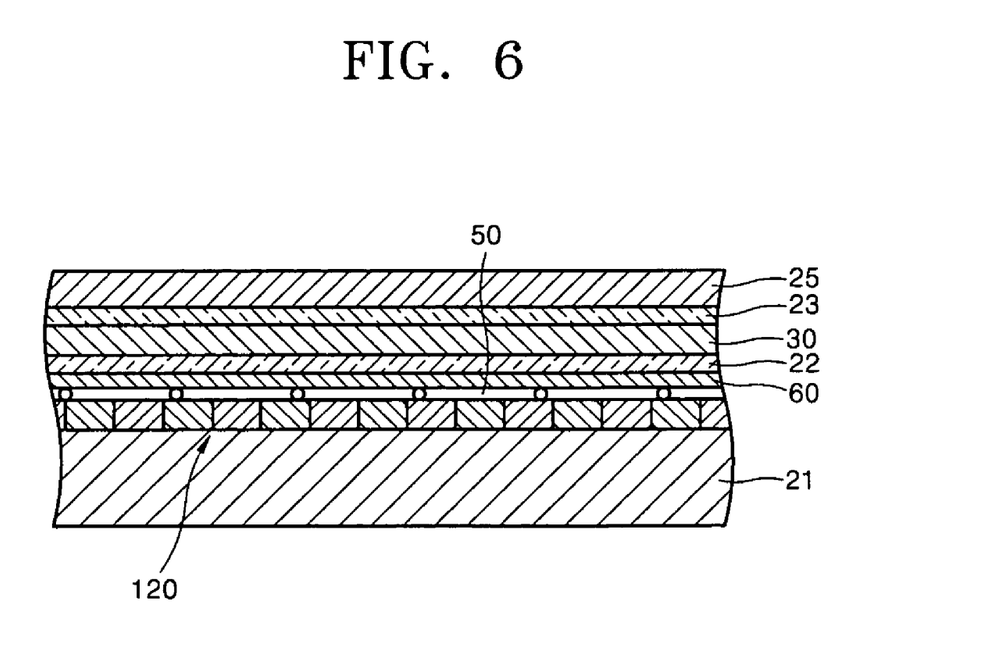

In the above-described embodiments, as shown in FIGS. 5 and 6, an index layer 60 with a refractive index higher than the refractive indices of the fine space layer 50 and the first electrode layer 22 may be formed between the fine space layer 50 and the first electrode layer 22. Preferably, the index layer 60 is formed of a material with a refractive index of 2.3 or greater, for example, $TiO_2$. However, the material of the index layer 60 is not limited to a material with a refractive index of 2.3 or greater.

Figure 7:
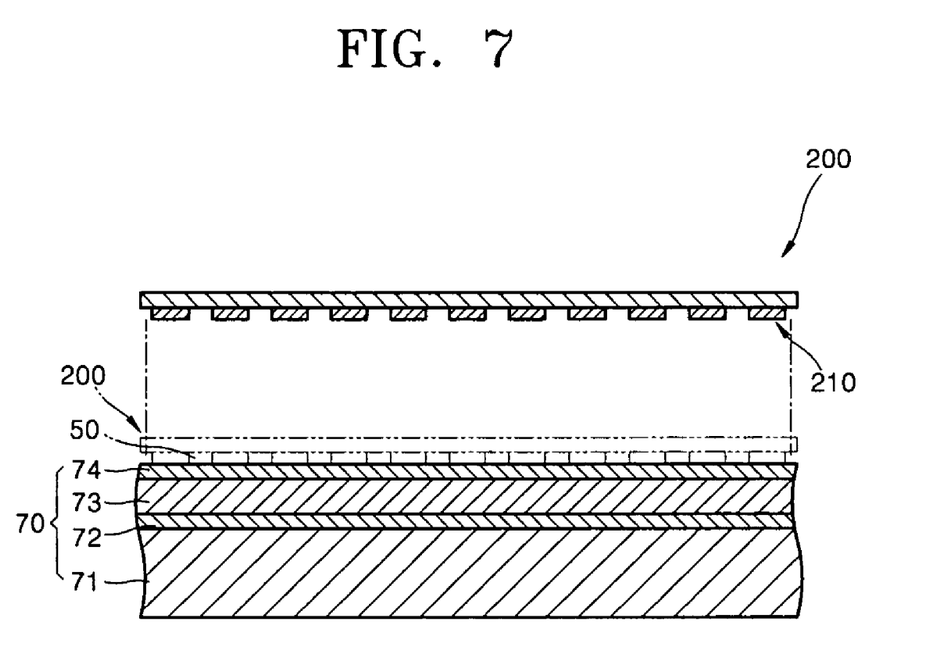
FIGS. 7 and 8 are cross-sections of organic EL display device assemblies according to fifth and sixth embodiments of the present invention.
Figure 8:
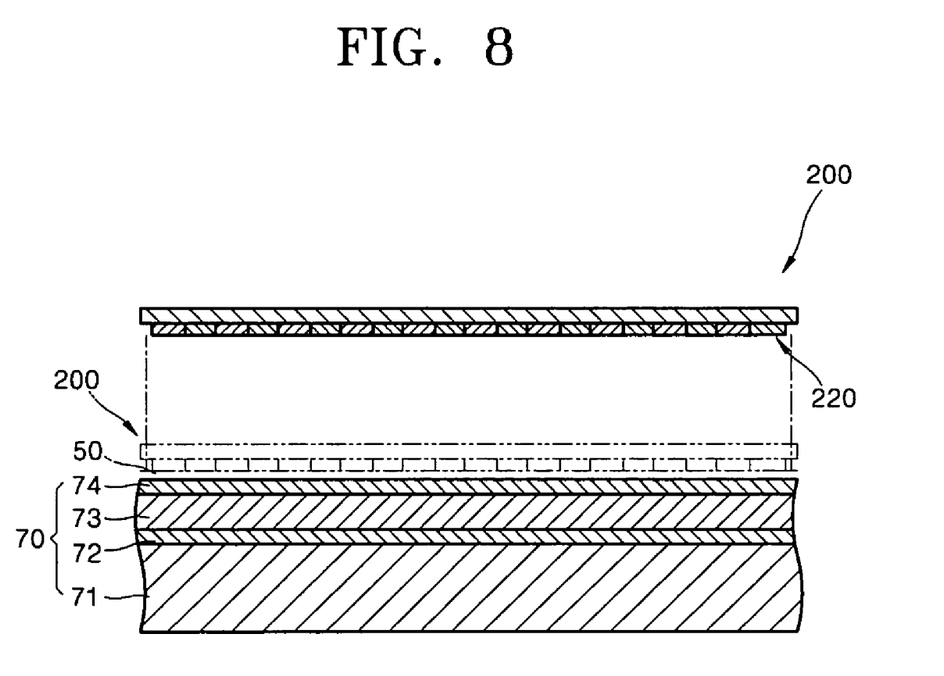

As shown in FIGS. 7 and 8, an organic EL display device assembly includes an organic EL display portion 70, which has a first electrode layer 72 formed on a substrate 71, an organic luminescent layer 73 formed on the first electrode layer 72 to have a predetermined pattern, and a second electrode layer 74 formed of a transparent conductive metal on the organic luminescent layer 73. The organic EL display portion 70 is combined with a photonic plate 200 on which an optical loss prevention layer 210 or 220 is formed and the fine space layer 50 is formed between the organic EL display portion 70 and the photonic plate 200.

As shown in FIG. 7, the optical loss prevention layer 210 formed on the photonic plate 200 is comprised of protrusions 211, each having a predetermined height. Alternatively, as shown in FIG. 8, the optical loss prevention layer 220 is a thin film having first and second areas formed of two materials with different refractive indices. Here, at least one of the first and second areas is patterned. The first areas of the optical loss prevention layer 220 may be arranged in dots, but the first areas are not limited to such an arrangement. Preferably, the difference between the refractive indices of the materials of the first and second areas is no less than 0.3 and no more than 3. More preferably, the refractive index difference is as large as possible within the range of 0.3 to 3. If the refractive index difference is less than or equal to 0.3, the interface between the organic luminescent layer 73 and each of the electrode layers 72, 74 provides a low scattering efficiency. Thus, the amount of light emitted from the organic luminescent layer 73 that is reflected at the interface increases, and accordingly, the amount of light that is bled off and penetrates the substrate 71 decreases.

Figure 9:
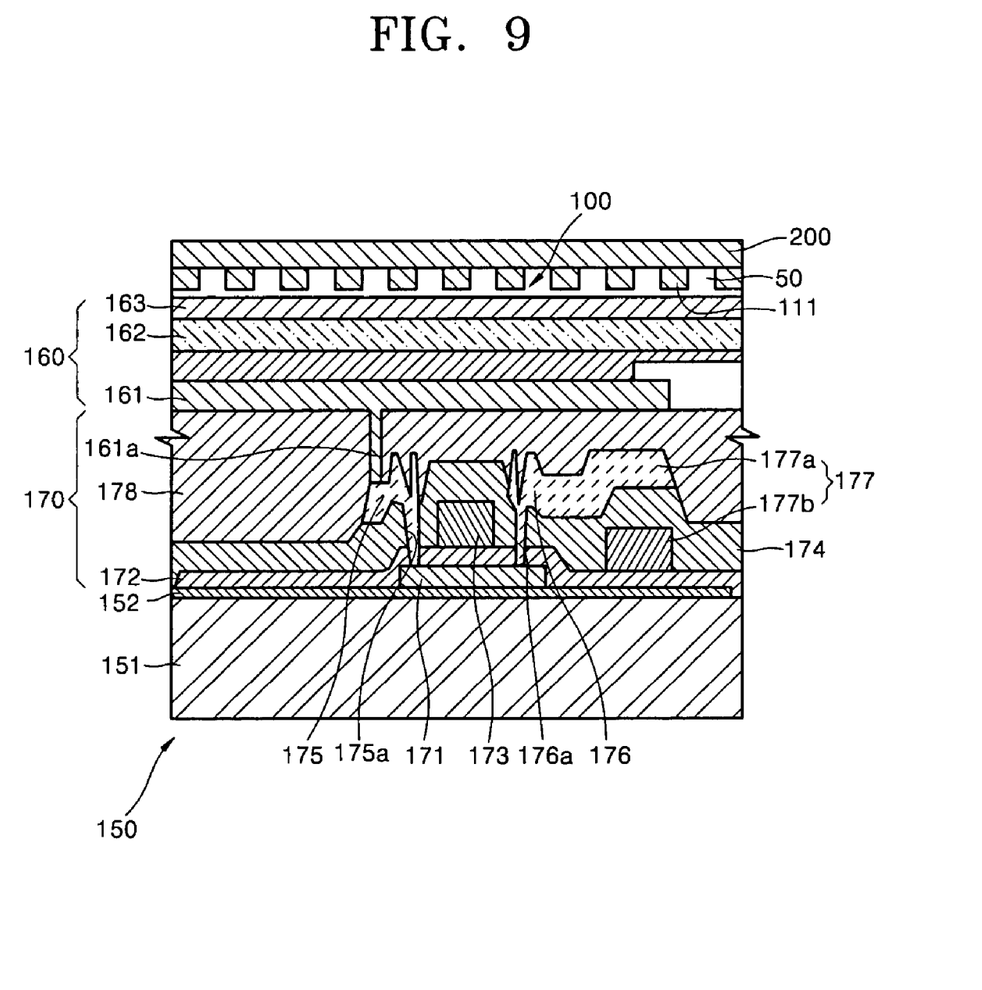
FIGS. 9 through 12 are cross-sections of organic EL display device assemblies according to seventh through tenth embodiments of the present invention.
Figure 10:
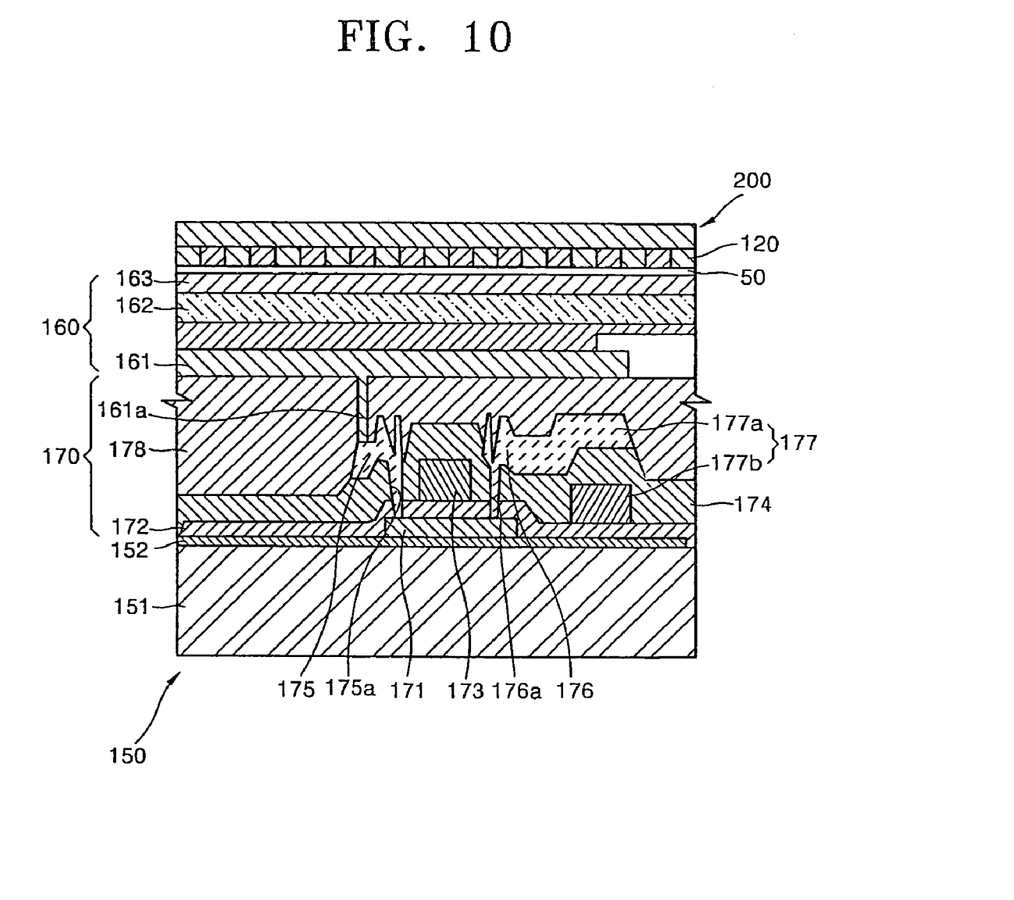

FIGS. 9 and 10 illustrate embodiments of an active matrix (AM) organic EL display device assembly 150, which are organic EL display device assemblies according to different embodiments of the present invention. Referring to FIG. 9, the AM organic EL display device assembly 150 includes a buffer layer 152, a pixel area 160, and a driving area 170. The buffer layer 152 is formed on a transparent substrate 151. The pixel area 160 includes pixels and a second electrode layer 161 for forming the pixels and is formed over the buffer layer 152. The driving area 170 includes a thin film transistor (TFT) and a capacitor 177 that are used to drive the pixel area 160, and is formed over the buffer layer 152.

In the driving area 170, a semiconductor layer 171 doped with p- or n-type impurities is formed on the upper surface of the buffer layer 152 to have a predetermined pattern, and is buried under a gate insulating layer 172. A gate electrode layer 173 is formed on the upper surface of the gate insulating layer 172 and opposite to the semiconductor layer 171. A first insulating layer 174 is also formed on the upper surface of the gate insulating layer 172 and covers the gate electrode layer 173. The thin film transistor is composed of drain and source electrodes 175 and 176 formed on the upper surface of the first insulating layer 174. Here, drain and source electrodes 175 and 176 are partially connected to both ends of the semiconductor layer 171 through contact holes 175a and 176a formed through the first insulating layer 174 and the gate insulating layer 172. The capacitor 177 includes first auxiliary electrodes 177a that are connected to the source electrodes 176 and are formed on the upper surface of the first insulating layer 174, and second auxiliary electrodes 177b that are opposite to the first auxiliary electrodes 177a and are buried under the first insulating layer 174. A second insulating layer 178 for achieving smoothing is formed on the upper surface of the first insulating layer 174 having the drain and source electrodes 175 and 176 formed thereon.

In the pixel area 160, a second electrode layer 161 is formed on the upper surface of the second insulating layer 178 to have a predetermined pattern and to be electrically connected to the drain electrode 175 through a conductive connector 161a formed within the second insulating layer 178. An organic luminescent layer 162 is formed on the upper surface of the second electrode layer 161 to have a predetermined pattern. A first transparent electrode layer 163 is formed on the organic luminescent layer 162. A third insulating layer (not shown) for achieving planarization may be formed on the upper surface of the second insulating layer 178 on which the first electrode layer 163 has been formed. Preferably, the third insulating layer is formed of a transparent material that does not interfere with the bleeding of light emitted from the organic luminescent layer 162.

The photonic plate 200 on which the optical loss prevention layer 100 is formed is attached to the third insulating layer of the organic EL display device assembly, thus forming the fine space layer 50 between the third insulating layer and the photonic plate 200. As described above, the fine space layer 50 may be filled with an inert gas or evacuated. As shown in FIG. 9, the optical loss prevention layer 100 on the photonic plate 200 may be composed of protrusions 111 with a predetermined pitch and a predetermined height. Alternatively, as shown in FIG. 10 the optical loss prevention layer 120 may be a thin film formed of different materials with different refractive indices to have first and second areas.

Figure 11:
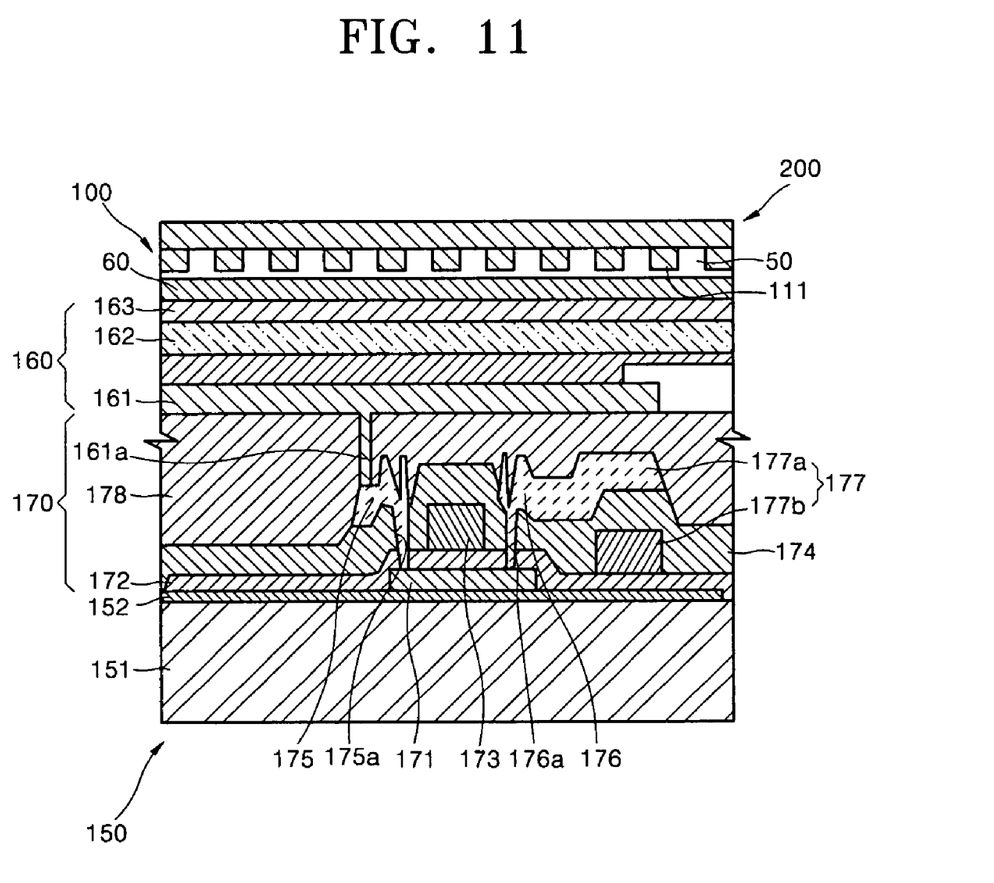
Figure 12:
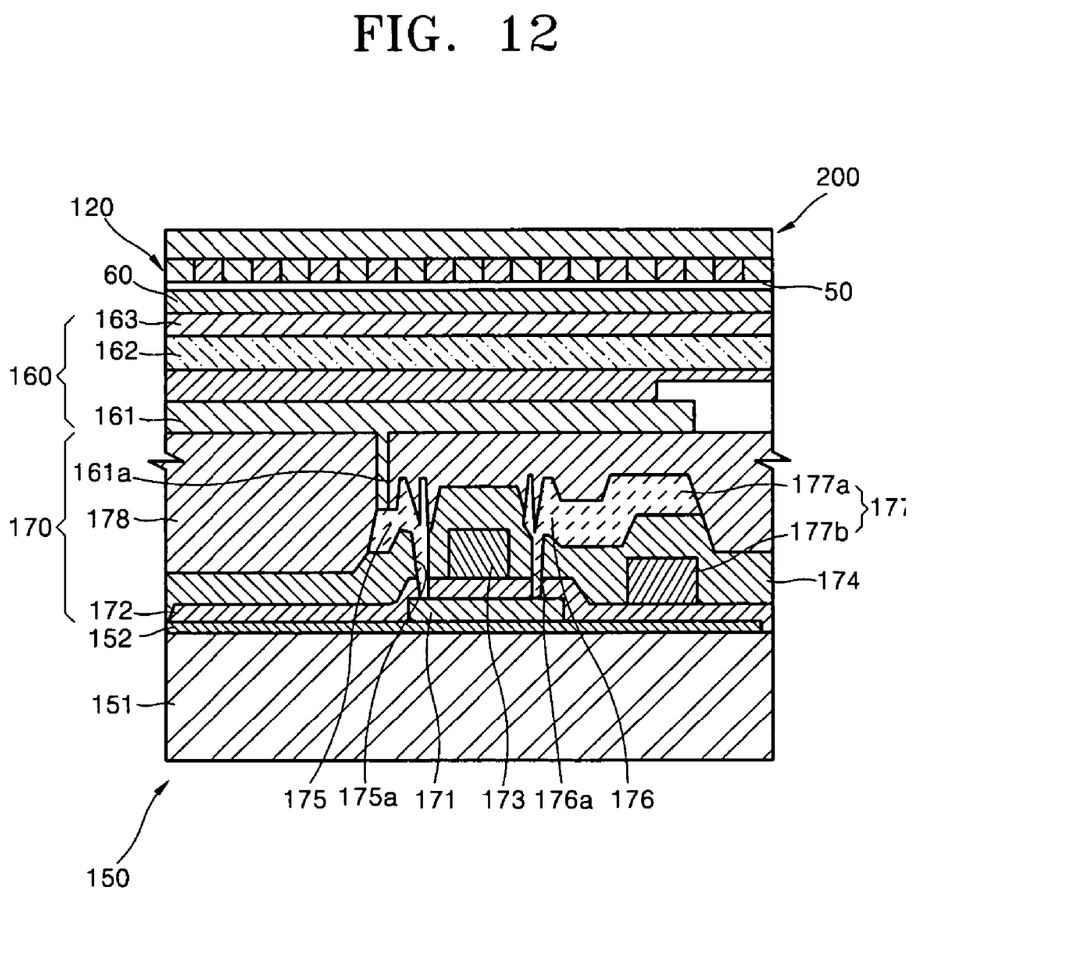

As shown in FIGS. 11 and 12, an index layer 60 may be further formed on the upper surface of the third insulating layer (not shown). Since the structures of the optical loss prevention layer 100 and the index layer 60 are the same as described in the previous embodiments, they will not be described here in greater detail.

The locations of the optical loss prevention layer and the fine space layer are not limited to the above-described embodiments. The optical loss prevention layer and the fine space layer may be formed between layers with high refractive indices on a path where light emitted from the organic luminescent layer bleeds. For example, in rear luminescence type organic EL display devices, an optical loss prevention layer and a fine space layer are formed on a substrate.

In organic EL display device assemblies having structures as in the above-described embodiments, when a predetermined voltage is applied thereto to illuminate selected pixels on the first electrode layer 22 or 72 and the second electrode layer 23 or 74, holes introduced from the first electrode layer 22 or 72, which is an anode, move to the hole transport layer 32 via the hole injection layer 31, while electrons are injected into the luminescent layer 33 or 73 via the electron injection layer 34. The electrons and holes are re-united in the luminescent layer 33 or 73 to create excitons. As the excitons de-excite, fluorescent molecules in the luminescent layer 33 or 73 emit light. The generated light bleeds to the outside via the first electrode layer 22 or 72, the optical loss prevention layer 100, 120, 210, or 220, and the fine space layer 50.

Because the optical loss prevention layer 100, 120, 210, or 220 and the fine space layer 50 are formed of ITO between the first electrode layer 22 or 72 and the substrate 21 or 71 or between the third insulating layer (not shown) and the photonic plate 200, optical loss due to the reflection of light at the interface between the substrate and the electrode layer may be reduced.

In other words, since the refractive index of the organic luminescent layer 30 (or 70) or the first electrode layer 22 (or 72) is higher than the refractive index of the second insulating layer or glass for the fine space layer 50, light is reflected at the interface between the substrate 21 (or 71) and the first electrode layer 22 (or 72). However, because the fine space layer 50 and the optical loss prevention layer 100 (or 210) are formed between the first electrode layer 22 (or 72) and the substrate 21 (or 71) or between the third insulating layer (not shown) and the photonic plate 200, the first electrode layer 22 (or 72) and the protrusions 111 of the optical loss prevention layer 100 (or 210) cause evanescent wave coupling. Accordingly, the fine space layer 50 between the first electrode layer 22 (or 72) and each of the protrusions 111 generates evanescent waves. Thus, part of light guided by the first electrode layer 22 (or 72) is transported to and diffracted by the optical loss prevention layer 100 (or 210). Consequently, light bleeding efficiency increases.

If the thin film 120 or 220 having first and second areas defined by patterning two different materials with different refractive indices is adopted as an optical loss prevention layer, the first and second areas cross each other. Accordingly, the mean refractive index of the optical loss prevention layer may be adjusted to a refractive index that may widen a total reflection angle. Thus, an anti-reflection occurs to improve the light bleeding efficiency.

The following experiments were performed to compare the amount of light bleeding in an organic EL display device having the fine space layer 50 and the optical loss prevention layer 100 (or 210), the amount of light bleeding in an organic EL display device having only the optical loss prevention layer 100 (or 210), and the amount of light bleeding in an organic EL display device having neither fine space layers nor optical loss prevention layers.

First Experiment

The first experiment was performed on an organic EL display device in which an optical loss prevention layer having cylindrical protrusions was formed of $SiO_2$, $TiO_2$, and $SiN_x$ on the upper surface of a substrate. The pitch between adjacent protrusions was in the range of 200 nm to 2000 nm, and the height of each of the protrusions was in the range of 50 nm to 5000 nm.

Figure 13:
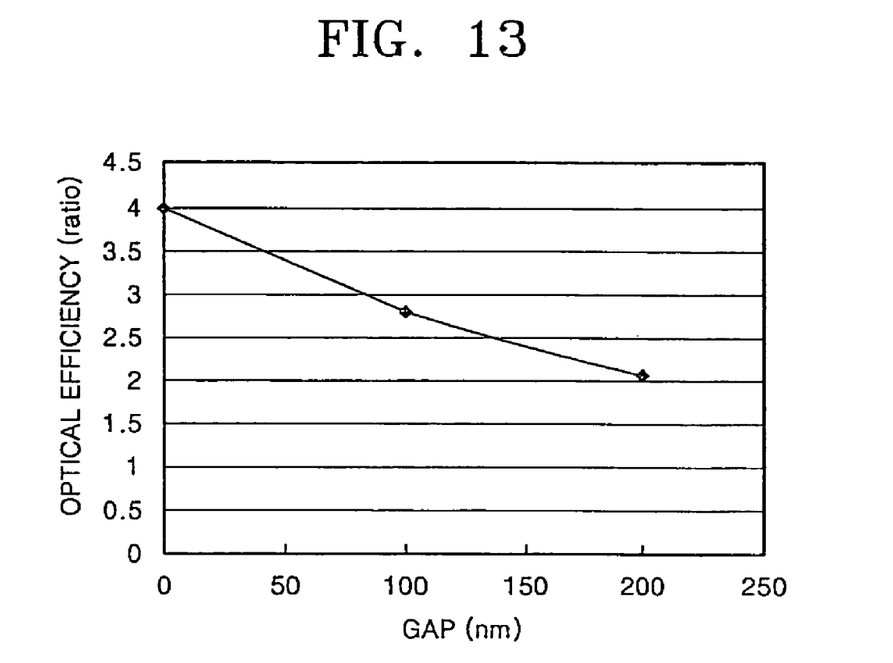
FIG. 13 is a graph showing optical efficiency versus a gap between an optical loss prevention layer and an electrode layer.
Figure 14:
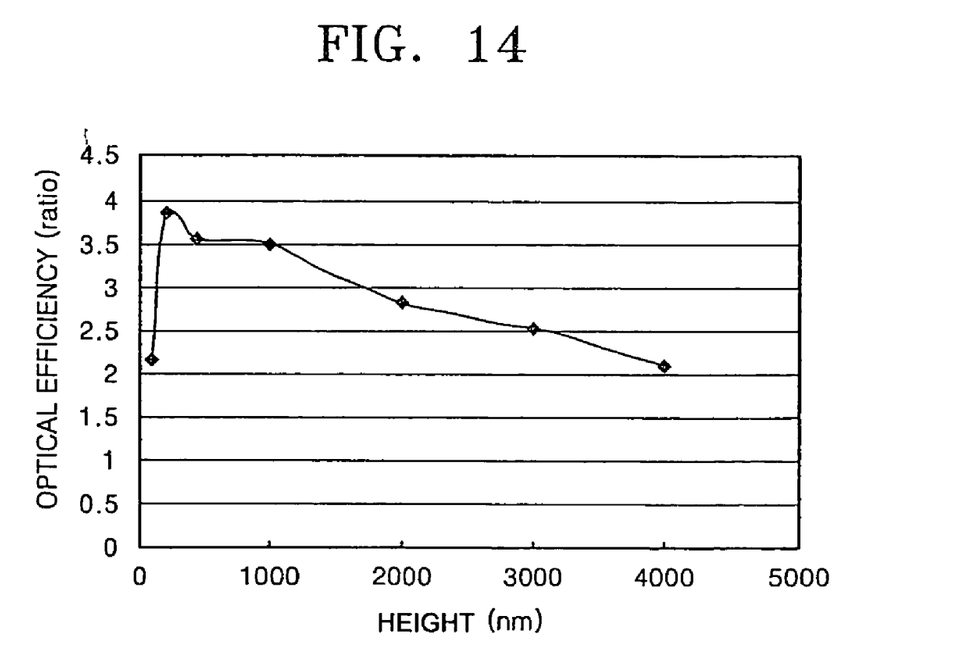
FIG. 14 is a graph showing optical efficiency versus a height of protrusions of the optical loss prevention layer.

A first electrode layer, an organic luminescent layer, and a second electrode layer were sequentially stacked on the upper surface of the resulting substrate and between the resulting substrate and a fine space layer. FIG. 13 is a graph of a measured optical efficiency versus the width of the gap of the fine space layer. FIG. 14 is a graph of optical efficiency versus the height of the cylindrical protrusions.

Through the first experiment, standardized optical energy values were calculated for different widths of the gap of the fine space layer using a Finite Difference Time Domain (FDTD) simulation. In other words, the standardized optical energy values were calculated by comparison with the optical energy value of an organic EL display device used in a first comparative experiment to be described later.

As shown in FIG. 13, when the width of the gap of the fine space layer is 0, that is, when the upper surface of each of the protrusions contacts the first electrode layer, the amount of light bleeding to the outside was four times greater than the amount of light bleeding in a conventional organic EL display device. As the width of the gap of the fine space layer increases, the optical efficiency, that is, the amount of light bleeding, decreases.

Also, when the protrusions of the optical loss prevention layer were formed of $SiO_2$, the absolute amount of light bleeding was 2.41 times greater than that of the conventional organic EL display device. When the protrusions of the optical loss prevention layer were formed of $TiO_2$, the absolute amount of light bleeding was 3.90 times greater than that of the conventional organic EL display device. When the protrusions of the optical loss prevention layer were formed of $SiN_x$, the absolute amount of light bleeding was 3.67 times greater than that of the conventional organic EL display device.

As shown in FIG. 14, the optical efficiency is proportional to the height of each of the protrusions up to a height of about 200 nm.

Second Experiment

Figure 15:
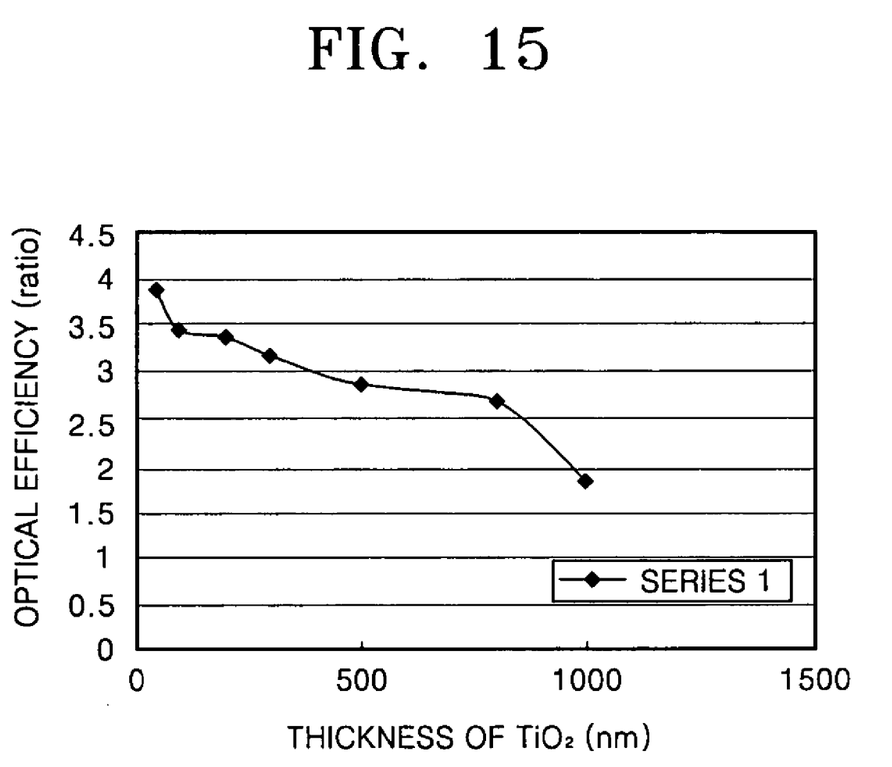
FIG. 15 is a graph showing optical efficiency versus a thickness of an index layer of $TiO_2$ in an organic EL display device assembly.

The second experiment was performed on an organic EL display device in which an index layer was formed of $TiO_2$ with a refractive index of 2.36 between the fine space layer and the first electrode layer under the same conditions as in the first experiment. FIG. 15 is a graph of optical efficiency versus the thickness of the index layer. Here, the gap of the fine space layer was 0, and the protrusions of the optical loss prevention layer were 400 nm high.

According to FIG. 15, when the thickness of the index layer was 50 nm, the optical efficiency increased by about 4 times and the amount of light bleeding increased by 47.1% compared to the organic EL display device of the first comparative experiment.

First Comparative Experiment

The first comparative experiment was performed on an organic EL display device in which a first electrode layer, an organic luminescent layer, and a second electrode layer were simply formed on the upper surface of a transparent substrate.

In the organic EL display device, the amount of light guided by the transparent substrate was 34.9% of the amount of light guided to the organic luminescent layer, the amount of light reflected by the interface between the first and second electrode layers was 42.8% of the amount of light guided to the organic luminescent layer, and the amount of light bled to the outside was 22.3% of the amount of light guided to the organic luminescent layer.

Second Comparative Experiment

A second comparative experiment was performed on an organic EL display device in which a first electrode layer, an organic luminescent layer, and a second electrode layer were formed on the upper surface of a substrate, and a diffraction grating (i.e., optical loss prevention layer) was formed on the layer having the greatest refractive index among the first and second electrode layers and the organic luminescent layer. The diffraction grating was formed of $SiO_2$ or $TiO_2$ to have a plurality of protrusions each having a predetermined pitch.

According to the second comparative experiment, when the diffraction grating was formed of $SiO_2$, the amount of light bleeding was 2.37 times that of the organic EL display device used in the first comparative experiment. When the diffraction grating was formed of $TiO_2$, the amount of light bleeding was 2.38 times that of the organic EL display device used in the first comparative experiment.

In organic EL display device assemblies having the above-described structures, a fine space layer is formed between an optical loss prevention layer and an electrode layer, thereby reducing internal optical loss and accordingly increasing light bleeding efficiency. In particular, light bleeding may be increased by preventing reflection from occurring among a first electrode layer, an organic luminescent layer, and a second electrode layer. Also, suppression of bleeding of light reflected by a substrate may prevent blurring of images formed by the organic EL display device assemblies.

Figure 16:
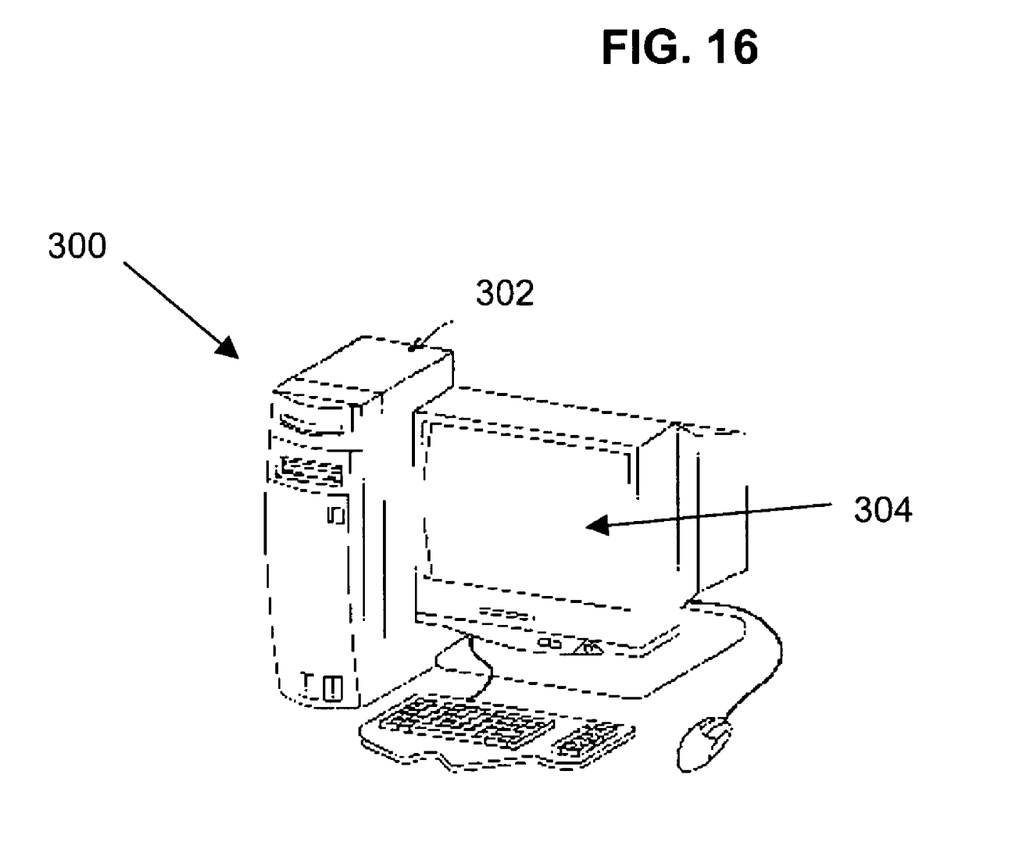
FIG. 16 is a representation of an example of a desktop computer utilizing an organic EL display device assembly in accordance with an embodiment of the present invention.

FIG. 16 is a representation of an example of a desktop computer 300 utilizing an organic EL display device assembly 304 in accordance with an embodiment of the present invention. The desktop computer 300 comprises a central processing unit 302 as is known in the art and an organic electroluminescence (EL) display device assembly 304 as described more fully above.

Figure 17:
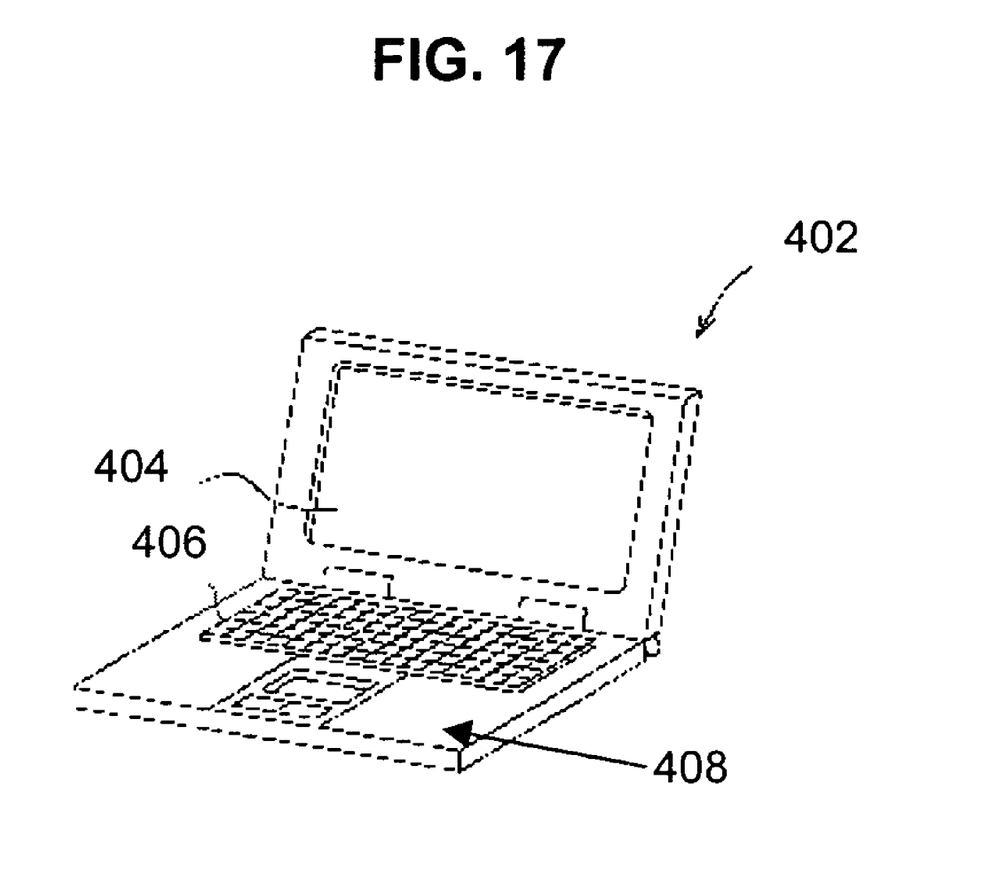
FIG. 17 is a representation of an example of a laptop computer utilizing an organic EL display device assembly in accordance with an embodiment of the present invention.

FIG. 17 is a representation of an example of a laptop computer 402 utilizing an organic EL display device assembly 404 in accordance with an embodiment of the present invention. The laptop computer 402 comprises a central processing unit 408 as is known in the art and an organic electroluminescence (EL) display device assembly 404 as described more fully above. A keyboard 406 may be implemented to input data.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescence (EL) display device assembly comprising:
   a substrate;
   an organic EL portion having a first electrode layer, an organic luminescent layer, and a second electrode layer, which are each patterned and stacked proximate to an upper surface of the substrate; and
   an optical loss prevention layer to increase light bleeding efficiency, wherein a fine space layer is formed between the optical loss prevention layer and the organic EL portion and is filled with a gas or evacuated.

2. The organic EL display device assembly of claim 1, wherein the optical loss prevention layer is a diffraction grating having a plurality of protrusions formed on the upper surface of the substrate with a predetermined pitch between adjacent protrusions.

3. The organic EL display device assembly of claim 2, wherein the protrusions contact the second electrode layer.

4. The organic EL display device assembly of claim 2, wherein the pitch between adjacent protrusions is 200 nm to 2000 nm.

5. The organic EL display device assembly of claim 4, wherein the height of each of the protrusions is 50 nm to 5000 nm.

6. The organic EL display device assembly of claim 1, wherein the second electrode layer is formed of indium tin oxide (ITO).

7. The organic EL display device assembly of claim 1, wherein the optical loss prevention layer is formed of at least one material selected from the group consisting of $SiO_x$ (x>1), $SiN_x$, $Si_3N_4$, $TiO_2$, $MgO$, $ZnO$, $Al_2O_3$, $SnO_2$, $In_2O_3$, $MgF_2$, and $CaF_2$.

8. The organic EL display device assembly of claim 7, wherein the optical loss prevention layer is formed of $TiO_2$.

9. The organic EL display device assembly of claim 1, further comprising an index layer with a substantial refractive index formed between the fine space layer and the second electrode layer.

10. The organic EL display device assembly of claim 9, wherein the index layer is formed of $TiO_2$.

11. The organic EL display device assembly of claim 9, wherein the refractive index of the index layer is greater than or equal to 2.3.

12. The organic EL display device assembly of claim 9, wherein the thickness of the index layer is less than or equal to 2000 nm.

13. An organic EL display device assembly comprising:
a substrate;
an organic EL display portion having a first electrode layer, an organic luminescent layer, and a second electrode layer, which are each patterned and stacked on an upper surface of the substrate; and
a photonic plate which forms a fine space layer by combining with the organic EL display portion and has an optical loss prevention layer.

14. The organic EL display device assembly of claim 13, wherein the optical loss prevention layer of the photonic plate has a plurality of protrusions formed on the upper surface of the substrate with a predetermined pitch between adjacent protrusions.

15. The organic EL display device assembly of claim 14, wherein the protrusions contact the second electrode layer.

16. The organic EL display device assembly of claim 14, wherein the pitch between adjacent protrusions is 200 nm to 2000 nm.

17. The organic EL display device assembly of claim 14, wherein the height of each of the protrusions is 50 nm to 5000 nm.

18. The organic EL display device assembly of claim 1, wherein the diffraction grating is formed of at least one material selected from the group consisting of $SiO_x$ (x>1), $SIN_x$, $Si_3N_4$, $TiO_2$, $MgO$, $ZnO$, $Al_2O_3$, $SnO_2$, $In_2O_3$, $MgF_2$, and $CaF_2$.

19. The organic EL display device assembly of claim 18, wherein the optical loss prevention layer is formed of $TiO_2$.

20. The organic EL display device assembly of claim 13, further comprising an index layer with a substantial refractive index formed between the fine space layer and the first electrode layer.

21. The organic EL display device assembly of claim 9, wherein the refractive index of the index layer is greater than or equal to 2.3.

22. An organic EL display device assembly comprising:
a substrate;
a pixel portion having a first electrode layer patterned on the substrate, an organic luminescent layer patterned on an upper surface of the first electrode layer, an insulating layer formed on an upper surface of the substrate to expose an organic luminescent layer, and a second electrode layer which is transparent and patterned on an upper surface of the organic luminescent layer and an upper surface of the insulating layer;
a driving portion formed on the substrate and having thin film transistors to switch the first electrode layer; and
a photonic plate formed on the upper surface of the first electrode layer, forming a fine space layer filled with an inert gas or evacuated, and having an optical loss prevention layer.

23. The organic EL display device assembly of claim 22, further comprising a planarization film formed on the upper surface of the first electrode layer.

24. The organic EL display device assembly of claim 22, wherein the optical loss prevention layer of the photonic plate has a plurality of protrusions formed on the upper surface of the substrate with a predetermined pitch between adjacent protrusions.

25. The organic EL display device assembly of claim 22, wherein the protrusions contact the second electrode layer.

26. The organic EL display device assembly of claim 24, wherein the pitch between adjacent protrusions is 200 nm to 2000 nm.

27. The organic EL display device assembly of claim 24, wherein the height of each of the protrusions is 50 nm to 5000 nm.

28. The organic EL display device assembly of claim 23, wherein the diffraction grating is formed of at least one material selected from the group consisting of $SiO_x$ (x>1), $SiN_x$, $Si_3N_4$, $TiO_2$, $MgO$, $ZnO$, $Al_2O_3$, $SnO_2$, $In_2O_3$, $MgF_2$, and $CaF_2$.

29. The organic EL display device assembly of claim 23, further comprising an index layer with a substantial refractive index formed between the fine space layer and the second electrode layer.

30. The organic EL display device assembly of claim 20, wherein the refractive index of the index layer is greater than or equal to 2.3.

31. An organic EL display device assembly comprising:
a substrate;
a first electrode layer, an organic luminescent layer, and a second electrode layer sequentially stacked proximate to an upper surface of the substrate; and
an optical loss prevention layer having a substantially different refractive index from a refractive index among the first electrode layer, the organic luminescent layer, and the second electrode layer, and being formed between the first electrode layer and the substrate,
wherein a fine space layer is formed between the optical loss prevention layer and the first electrode layer and is filled with a gas or evacuated.

32. The organic EL display device assembly of claim 31, wherein the optical loss prevention layer is a patterned thin film.

33. The organic EL display device assembly of claim 31, wherein the optical loss prevention layer comprises at least two area groups having different refractive indices, and a pitch between adjacent areas in one of the two area groups with different refractive indices of the optical loss prevention layer is 50 nm to 3000 nm.

34. The organic EL display device assembly of claim 3, wherein the thickness of the optical loss prevention layer is 0.01 μm to 50 μm.

35. The organic EL display device assembly of claim 31, wherein the optical loss prevention layer is formed of inorganic materials with refractive indices that differ by an amount in a range of 0.3 to 3.

36. The organic EL display device assembly of claim 35, wherein the inorganic materials are at least two materials selected from the group consisting of $SiO_x$ (x>1), $SiN_x$, $Si_3N_4$, $TiO_2$, MgO, ZnO, $Al_2O_3$, $SnO_2$, $In_2O_3$, $MgF_2$, and $CaF_2$.

37. The organic EL display device assembly of claim 1, wherein the optical loss prevention layer is formed of $SiO_x$ (x>1) and $TiO_2$ which have different refractive indices.

38. An organic EL display device assembly comprising:
a substrate;
a pixel portion having a first electrode layer patterned on the substrate, an organic luminescent layer patterned on an upper surface of the first electrode layer, an insulating layer formed on an upper surface of the substrate to expose an organic luminescent layer, and a second electrode layer which is transparent and patterned on an upper surface of the organic luminescent layer and an upper surface of the insulating layer;
a driving portion formed on the substrate and having thin film transistors to switch the first electrode layer;
a planarization film formed on the upper surface of the second electrode layer; and
a photonic plate which forms a fine space layer filled with an inert gas or evacuated by combination with the planarization film and has an optical loss prevention layer having patterned areas with different refractive indices.

39. The organic EL display device assembly of claim 38, wherein a pitch of one of the two patterned areas with different refractive indices of the optical loss prevention layer is 50 nm to 3000 nm.

40. The organic EL display device assembly of claim 38, further comprising an index layer with a substantial refractive index formed between the fine space layer and the first electrode layer.

41. The organic EL display device assembly of claim 40, wherein the refractive index of the index layer is greater than or equal to 2.3.

42. The organic EL display device assembly of claim 40, wherein the planarization film is formed on the upper surface of the first electrode layer.

43. The organic EL display device assembly of claim 32, wherein the pitch between adjacent areas in one of the two area groups with different refractive indices of the optical loss prevention layer is 50 nm to 3000 nm.

44. The organic electroluminescence (EL) display device assembly of claim 1, wherein the optical loss prevention layer comprises a patterned thin film having at least two materials with different refractive indices.

45. An organic electroluminescence (EL) display device assembly comprising:
a substrate;
an organic EL portion having a first electrode layer, an organic luminescent layer, a second electrode layer, which are each patterned and stacked on an upper surface of the substrate;
a first photonic plate disposed on the organic EL portion;
a second photonic plate disposed proximate to the first photonic plate;
an optical loss prevention layer, disposed on the second photonic plate and facing the first photonic plate, to increase light bleeding efficiency,
wherein a fine space layer is formed between the optical loss prevention layer and the optical loss prevention layer and is filled with a gas or evacuated.

46. The organic EL display device assembly of claim 8, wherein the optical loss prevention layer is formed of $SiO_x$ (x>1) and $TiO_2$ which have different refractive indices.

47. The organic EL display device assembly of claim 9, wherein the thickness of the index layer is less than or equal to 1500 nm.

48. The organic EL display device assembly of claim 9, wherein the thickness of the index layer is less than or equal to 1000 nm.

* * * * *